(12) United States Patent
Liu et al.

(10) Patent No.: US 7,308,802 B2
(45) Date of Patent: Dec. 18, 2007

(54) REFRIGERATION SYSTEM (75) Inventors: Tay-Jian Liu, Tu-Cheng (TW);
Chih-Peng Lee, Tu-Cheng (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 386 days.

(21) Appl. No.: 11/094,375

(22) Filed: Mar. 30, 2005

(65) Prior Publication Data

US 2006/0218955 A1 Oct. 5, 2006

(51) Int. Cl.
*F25D 23/12* (2006.01)
(52) U.S. Cl. .................................. 62/259.2
(58) Field of Classification Search .............. 62/259.2; 361/699, 715
See application file for complete search history.

(56) References Cited

U.S. PATENT DOCUMENTS 6,122,926 A * 9/2000 Kang et al. ................ 62/259.2
6,243,268 B1 * 6/2001 Kang et al. ................ 361/715
6,526,768 B2 3/2003 Wall et al.

* cited by examiner

*Primary Examiner*—Melvin Jones
(74) *Attorney, Agent, or Firm*—Morris Manning Martin LLP; Tim Tingkang Xia, Esq.

(57) ABSTRACT

A mounting assembly (30) for mounting an evaporator (21) of a refrigeration system (20) to an electronic component (10) includes a housing member (31) and a clamping member (32). The housing member defines a through hole (33) with the electronic component located therein. The evaporator is received in the through hole and located in axial alignment with the electronic component. The evaporator defines therein a fluid flow channel (25) for passage of a refrigerant fluid. The refrigeration system is in fluid communication with the fluid flow channel of the evaporator to supply refrigerant fluid thereto. The clamping member is attached to the housing member and has an abutting portion (84) integrally formed therefrom for exerting an uniform force to the evaporator to maintain the evaporator in thermal contact with the electronic component.

19 Claims, 7 Drawing Sheets

REFRIGERATION SYSTEM

BACKGROUND OF THE INVENTION

1. Field of the Invention

The present invention relates generally to refrigeration systems, and more particularly to a refrigeration system which can be firmly and uniformly attached to a heat generating component for removing heat therefrom.

2. Prior Art

It is well known in the electronic industry that cooling electronic components to below ambient temperature will greatly improve their operating efficiency. For example, it has been found that the performance of a desktop computer can be significantly improved by cooling the CPU to temperatures of −40 centigrade degrees or below.

It is also well-known that refrigeration systems can be used to cool electronic components to temperatures below ambient. The refrigeration system employs a refrigerant fluid circulating through a fluid flow channel defined in an evaporator which is attached to the CPU, to thereby cool the CPU.

Figure 8:
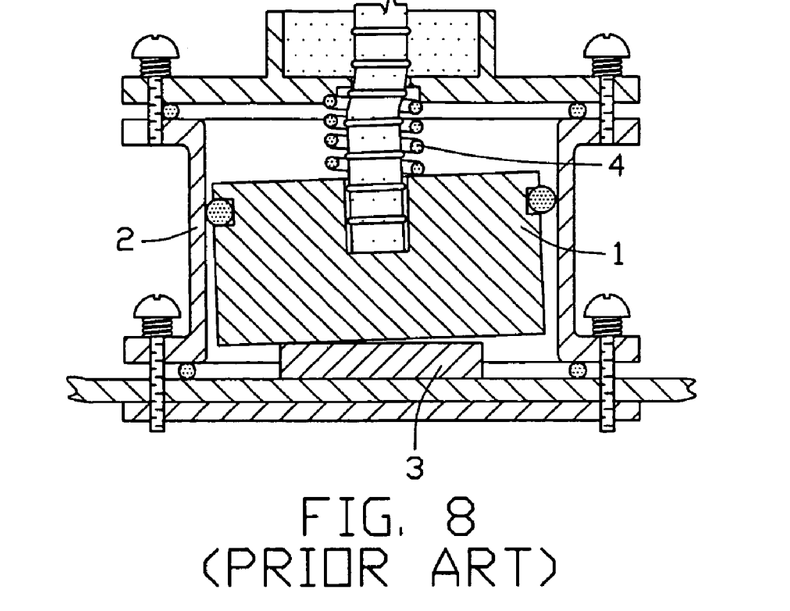
FIG. 8 is a diagrammatic representation showing an evaporator being secured by mismatching position.
Figure 9:
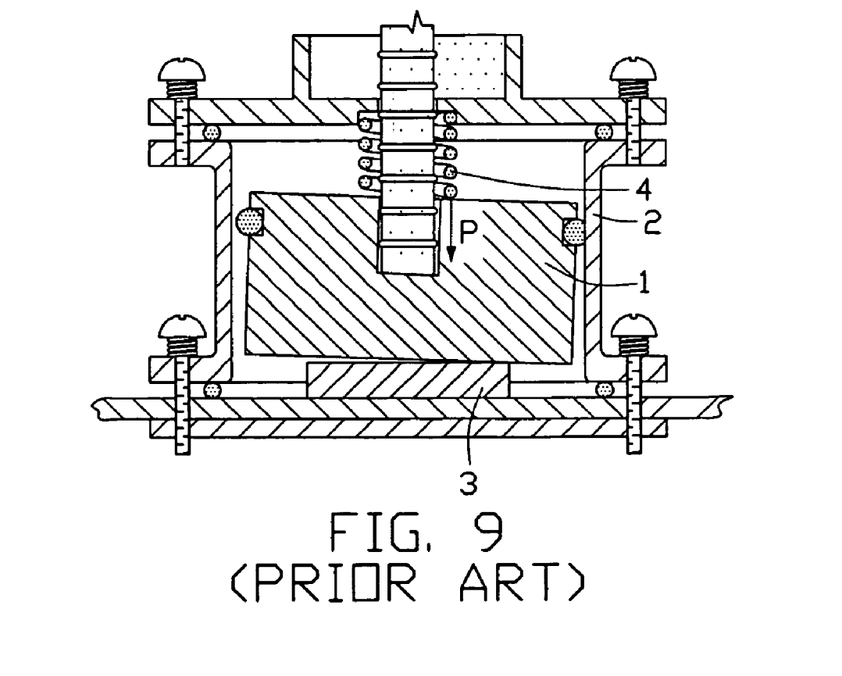
FIG. 9 is another diagrammatic representation showing the evaporator of FIG. 8 being secured by a imbalance force.

In particular, the evaporator of the refrigeration system is received in a receiving aperture defined in a housing member in which the CPU is located. A refrigeration system is in fluid communication with channels defined in the evaporator to supply refrigerant fluid thereto. A clamping arrangement is attached to the housing member with a helical wave spring located therebetween to therefore urge the evaporator into engagement with a top surface of the CPU. The clamping arrangement and the housing member serves as a mounting assembly to maintain a bottom surface of the evaporator being in thermal contact with the CPU and to keep the evaporator isolated from the ambient environment. However, the evaporator of the above-mentioned refrigeration system is prone to disengage from the CPU as the helical wave spring cannot firmly maintain the evaporator in close contact with the CPU at all events. For example, as shown in FIG. 8, when the evaporator 1 is inserted into and guided by the receiving aperture of the housing member 2, the evaporator 1 tends to offset to one side, resulting in the evaporator 1 partly contacting the CPU 3. On the other hand, the helical wave spring 4 generally cannot provide an uniform downward pressing force as of the small contact surface between the spring 4 and the top surface of the evaporator 1. As shown in FIG. 9, the downward force (indicated as P) exerted by the spring 4 downward presses the evaporator 1 at a small area apart from its center to thereby cause the evaporator 1 to incline with respect to and partly contact the CPU 3. As a common result of the above-mentioned problems, the bottom surface of the evaporator 1 falls into a position inclined with respect to and partly contacting the top surface of the CPU 3, which greatly decreases the heat dissipating efficiency of the refrigeration system.

SUMMARY OF THE INVENTION

Accordingly, an object of the present invention is to provide a mounting assembly which can firmly mount a refrigeration system to an electronic component.

In order to achieve the object set out above, a mounting assembly for mounting an evaporator of a refrigeration system to an electronic component in accordance with a preferred embodiment of the present invention comprises a housing member and a clamping member. The housing member defines a through hole with the electronic component located therein. The evaporator is received in the through hole of the housing member to thermally contact with the electronic component. The evaporator defines therein a fluid flow channel for passage of a refrigerant fluid. The clamping member is attached to the housing member so as to hermetically enclose the evaporator in the through hole of the housing member. The clamping member has an abutting portion integrally formed therefrom for exerting an uniform force to the evaporator to maintain the evaporator in thermal contact with the electronic component. The refrigeration system is in fluid communication with the fluid flow channel of the evaporator to supply refrigerant fluid thereto.

Other objects, advantages and novel features of the present invention will become more apparent from the following detailed description when taken in conjunction with the accompanying drawings, in which:

DETAILED DESCRIPTION OF THE INVENTION

Reference will now be made to the drawing figures to describe the present invention in detail.

Figure 1:
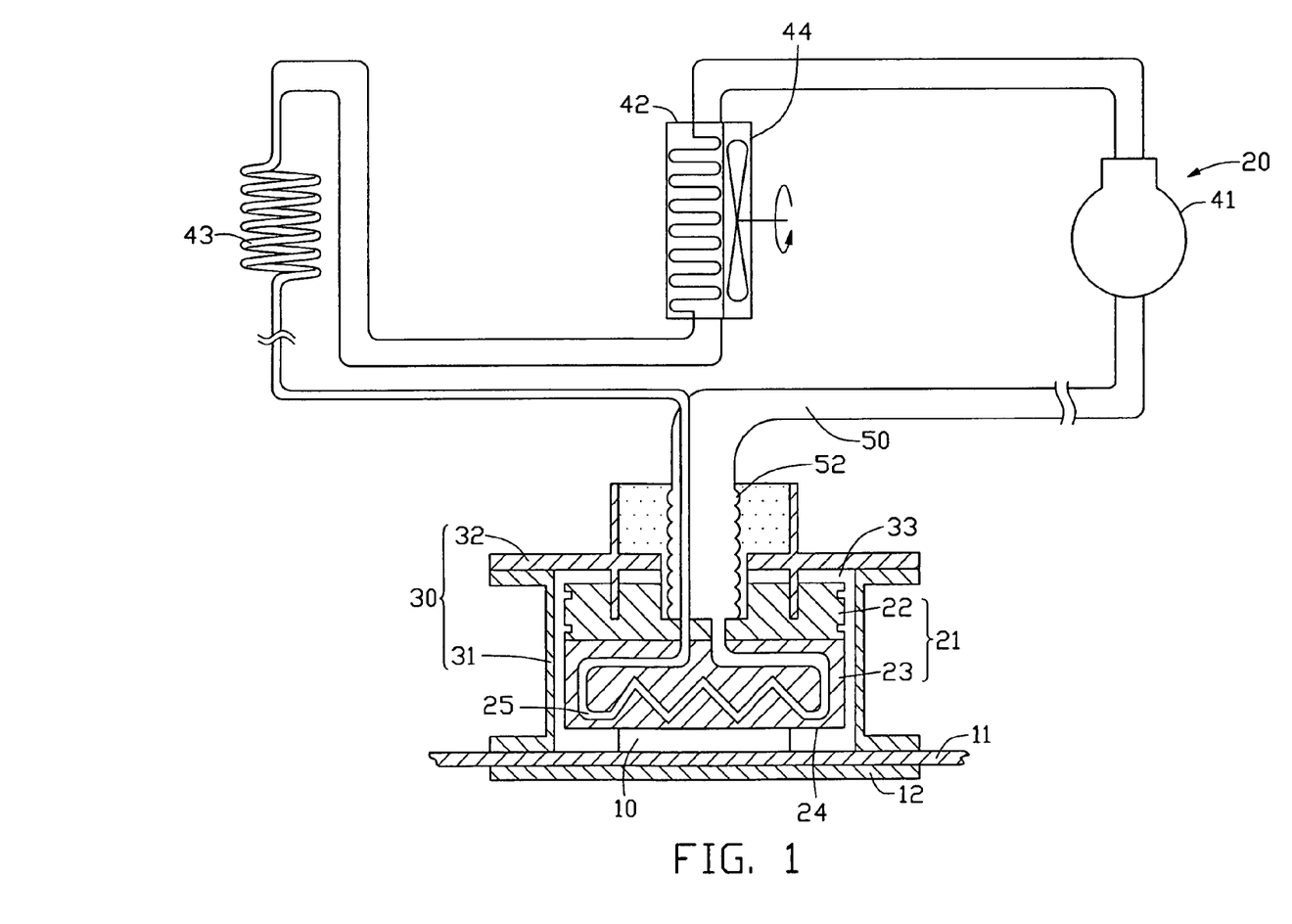
FIG. 1 is a diagrammatic representation of a mounting assembly for a refrigeration system in accordance with a preferred embodiment of the present invention.

FIG. 1 is a diagrammatic representation showing a refrigeration system 20 for removing heat from a CPU 10 which is mounted on a motherboard 11. The refrigeration system 20 generally comprises an evaporator 21, a compressor 41 and a condenser 42. The evaporator 21 is secured to the CPU 10 by a mounting assembly 30 which includes a housing member 31 defining a through hole 33 therein and a clamping member 32 attached to the housing member 31 to hermetically seal the through hole 33. The evaporator 21 is contained in the through hole 33 of the housing member 31 thereby being kept isolated from the ambient environment. A back plate 12 is preferably provided under the motherboard 11 opposite to the housing member 31 for avoiding undesirable condensation issue in conjunction with the motherboard 11.

The refrigeration system 20 employs a refrigerant fluid circulated so as to alternatively absorb and release thermal energy. In particular, this occurs when the refrigerant fluid changes between vaporous and liquid states. The refrigerant fluid absorbs excess thermal energy from the CPU 10 as it flows through a fluid flow channel 25 defined in the evaporator 21 and evaporates from a liquid state to a vaporous state. The low pressure vapor exiting the evaporator 21 is fed along an outlet tube 50 to the compressor 41. The resulting high pressure gas is then fed to the condenser 42, where the accumulated thermal energy dissipates. The refrigerant fluid is thus condensed to liquid state and returns back to the evaporator 21 through an inlet tube, i.e. a capillary tube 43. In addition, a cooling fan 44 is operative to provide forced airflow toward the condenser 42 for facilitating heat exchange. The outlet tube 50 has a corrugated portion 52 formed adjacent the evaporator 21 in order to provide thermal and mechanical isolation. The corrugated portion 52 and the capillary tube 43 are defined as two of communication parts of the refrigeration system 20 and the evaporator 21.

In the preferred embodiment of the present invention, the evaporator 21 includes a lower portion 23 having a cooled surface 24 in thermal contact with the CPU 10 and an upper portion 22 located above and connected to the lower portion 23 to thereby form an integral structure. This two-portion construction facilitates the manufacture of the fluid flow channel 25 and allows the two portions to be constructed from disparate metals or other suitable material. For example, the upper portion 22 may be formed from brass while the lower portion 23 is formed from copper which exhibits a higher thermal conductivity in relation to brass. Brazing or soldering are effective techniques for bonding the brass and copper portions together.

Figure 2:
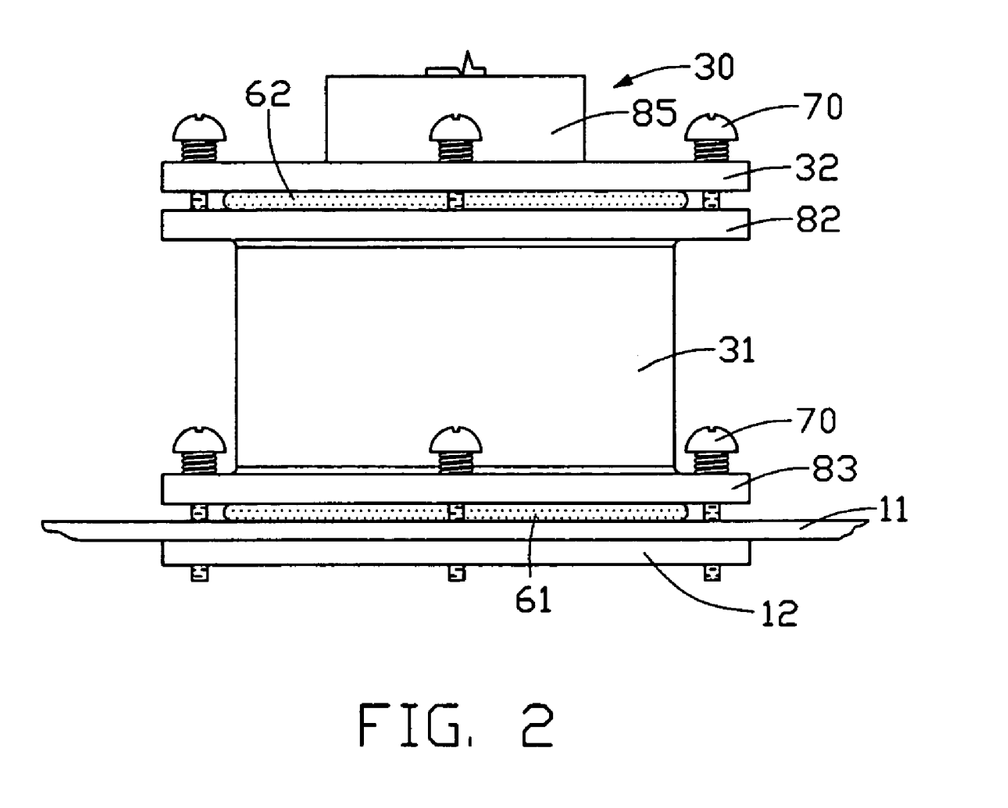
FIG. 2 is a side elevation view of the mounting assembly of FIG. 1.
Figure 3:
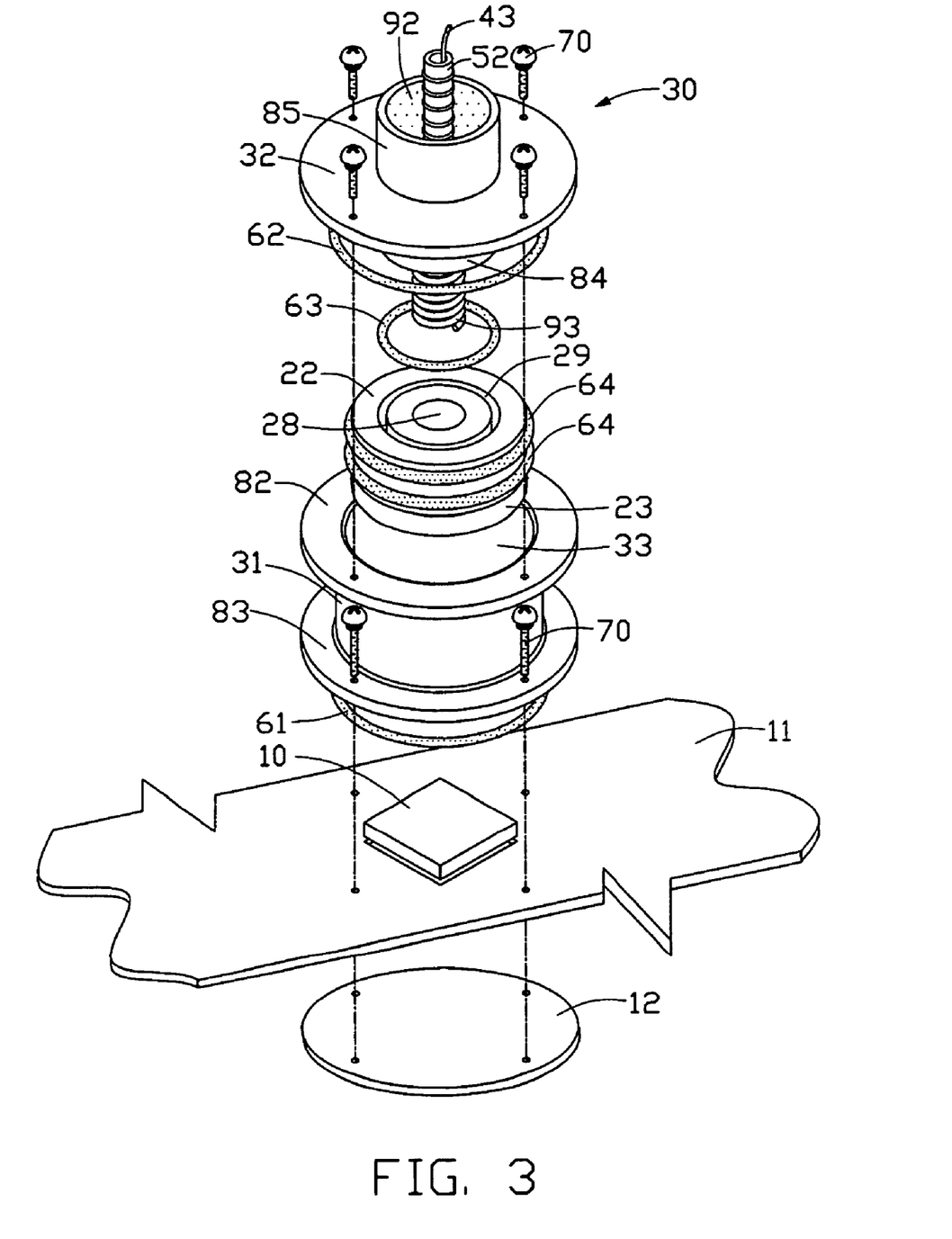
FIG. 3 is an exploded view of the mounting assembly of FIG. 2 showing various parts thereof.
Figure 4:
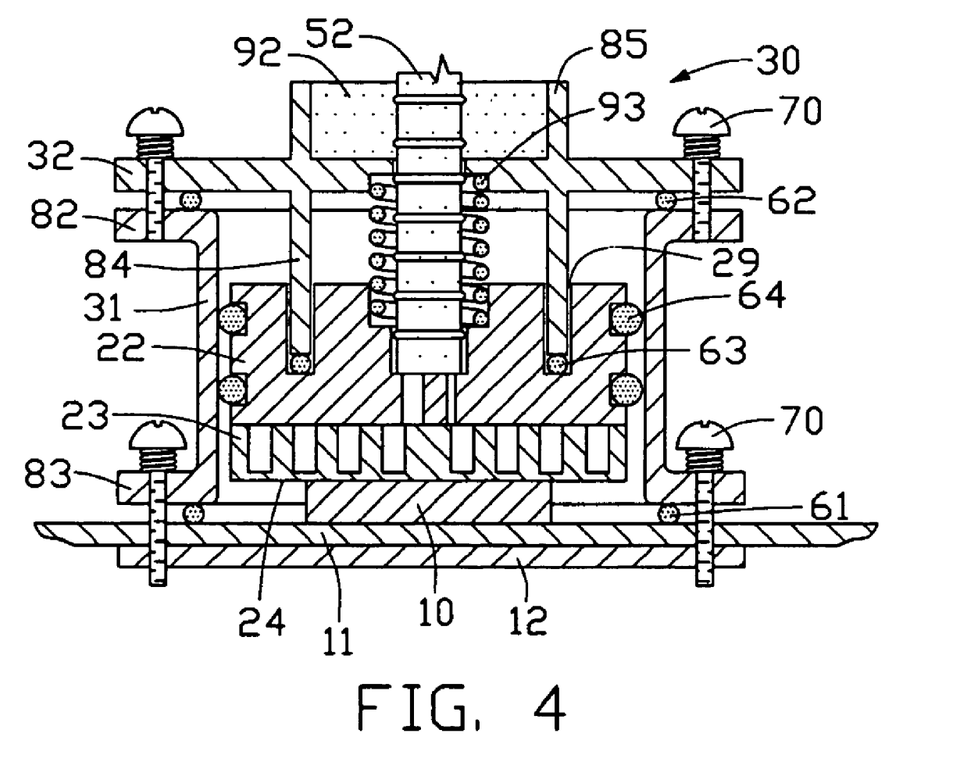
FIG. 4 is an sectional view of FIG. 2.

Referring now to FIGS. 2-4, certain additional details regarding the mounting assembly 30 will be most easily explained. The housing member 31 has a generally cylindrical configuration. Upper and lower flanges 82, 83 transversely extend outward from respective upper and lower portions of the housing member 31 for mounting purposes. The clamping member 32 is a round plate with an annular abutting wall 84 integrally extending downward therefrom. The upper portion 22 of the evaporator 21 defines a receiving groove 29 for receiving the abutting wall 84 when attached thereto. The capillary tube 43 and the corrugated tube 52 both are connected to the evaporator 21 preferably with the capillary tube 43 located inside of the corrugated tube 52. Foam 92 is preferably inserted between the corrugated tube 52 and an annular upward extension wall 85 which extends from the clamping member 32 in a direction opposite to the abutting wall 84. The motherboard 11, the housing member 31 and the clamping member 32 are secured together by a plurality of through bolts 70, preferably with seal elements 61, 62 respectively located therebetween. A seal element 63 is preferably disposed in the receiving groove 29 for providing resiliency between the abutting wall 84 of the clamping member 32 and the evaporator 21. The upper portion 22 of the evaporator 21 circumferentially defines a pair of spaced annular grooves (not labeled) with a pair of resilient seals 64 located therein engaging with an inner wall of the housing member 31. As a result, the evaporator 21 is maintained in good coaxial alignment with the housing member 31 and an interior of the housing member 31 is kept isolated from the ambient environment. A helical spring 93 is preferably provided between the clamping member 32 and the upper portion 22 of the evaporator 21 surrounding and abutting a circumference of the corrugated tube 52 for urging the evaporator 21 downwardly. A lower portion of the spring 93 is located in a positioning hole 28 defined in the upper portion 22 of the evaporator 21. The abutting portion 84 of the clamping member 32 surrounds the spring 93 and is located apart from the corrugated tube 52 and the capillary tube 43.

In the illustrated embodiment of the present invention, the evaporator 21 is located in axial alignment with the CPU 10 with the cooled surface 24 thereof being attached to a top surface of the CPU 10 via the annular abutting wall 84 of the clamping member 32 presses against the evaporator 21 downwardly to exert an uniform force towards the evaporator 21. The reception of the annular abutting wall 84 in the annular receiving groove 29 of the evaporator 21 provides a good positioning effect to therefore keep the evaporator 21 being balanced-positioned on the CPU 10 with the cooled surface 24 thereof in intimately thermal contact with the top surface of the CPU 10.

Figure 5:
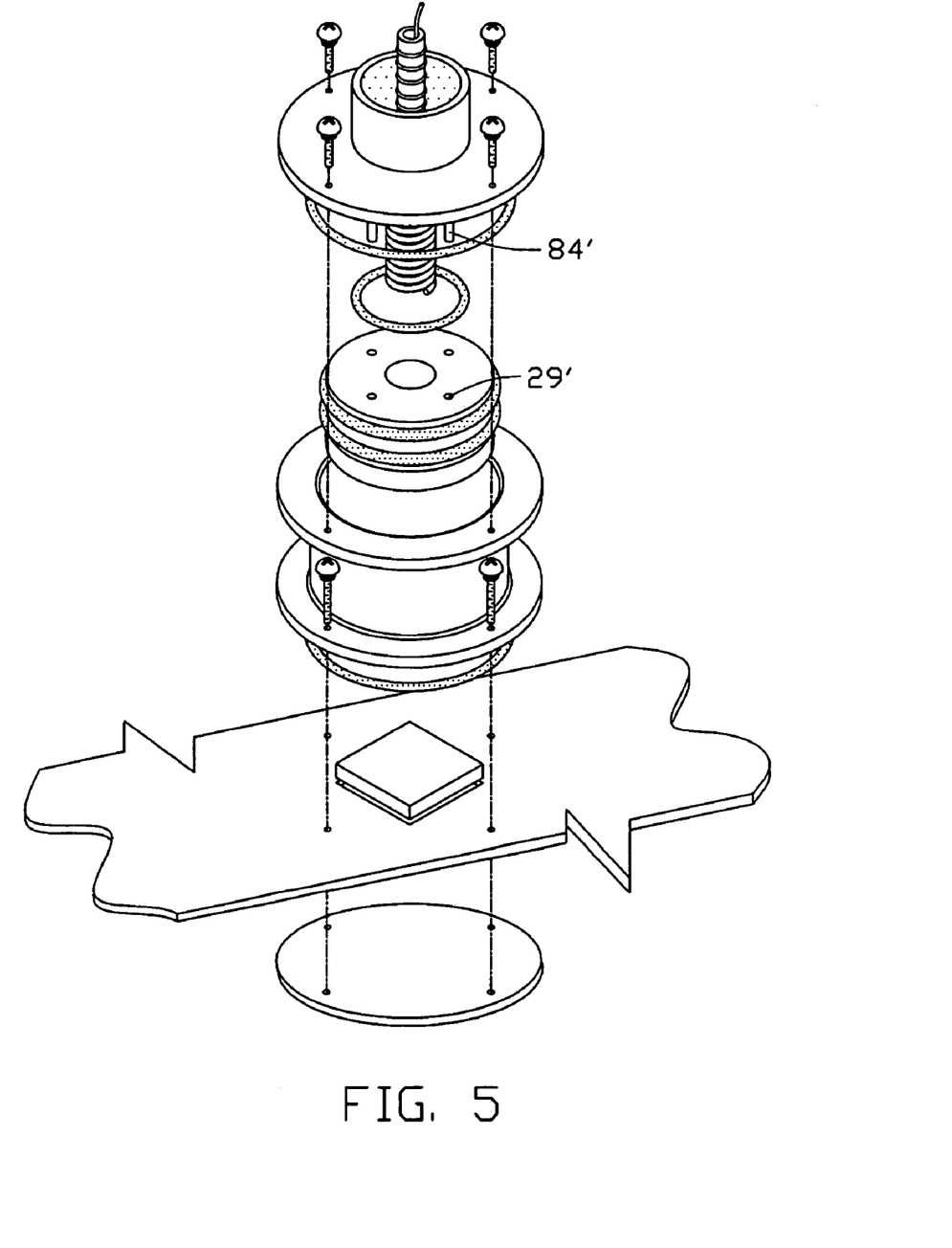
FIG. 5 is an alternative embodiment of the mounting assembly of FIG. 3.

FIG. 5 shows an alternative embodiment of the mounting assembly of the present invention. The evaporator defines a plurality of receiving openings 29' evenly distributed around the corrugated tube and located in a circle. The clamping member has a plurality of abutting elements 84' integrally extending therefrom for being received in the receiving openings 29' of the evaporator to thereby exert an uniform force on the evaporator to maintain the evaporator thermally contacting with the CPU 10. As one skilled in the art knows, the annular abutting wall 84 and the abutting elements 84' may also be separate from the clamping member 32 and is positioned between the clamping member 32 and the evaporator 21 in assembly.

Figure 6:
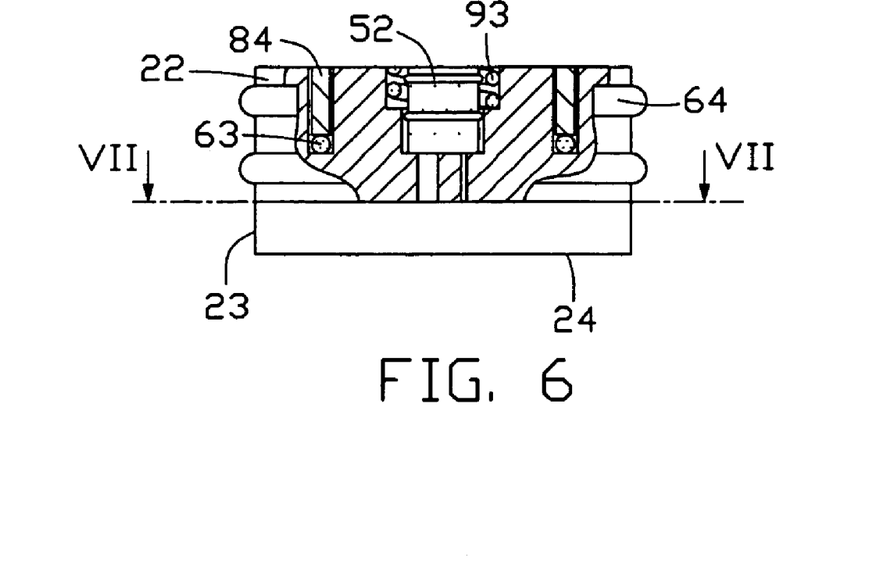
FIG. 6 is a partial sectional view of the evaporator of FIG. 4.
Figure 7:
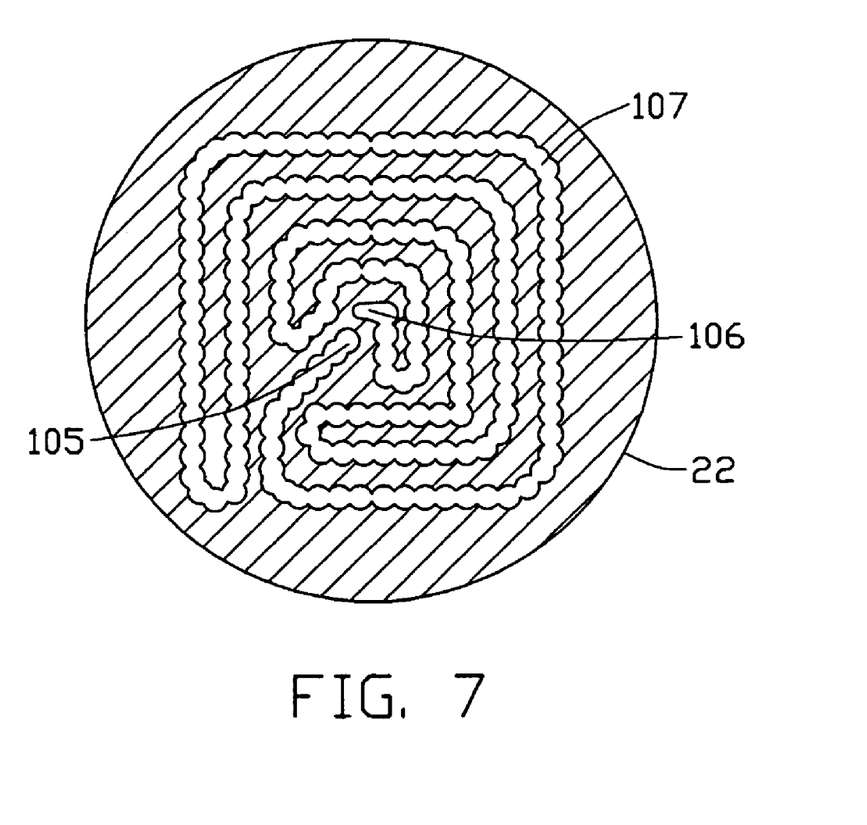
FIG. 7 is cross-sectional view taken along line □-□ of FIG. 6.

Referring to FIGS. 6-7, the configuration of the fluid flow channel 25 of the evaporator 21 can be most easily explained. The flow channel 25 is formed in the lower portion 23 of the evaporator 21 by drilling holes therein with a desirable pattern. For example, the flow channel 25 may be configured to have a plurality of interconnected rectangular passage segments 107 as shown in FIG. 6. The corrugated tube 52 and the capillary tube 43 are respectively connected with outlet and inlet holes 105, 106 of the flow channel 25. When the upper and lower portions 22, 23 are connected together, a complete fluid flow channel is thus formed in the evaporator 21.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling device for an electronic component comprising:

a housing member defining a through hole with said electronic component located therein;

an evaporator received in the through hole of the housing member and contacting with said electronic component, said evaporator defining therein a fluid flow channel for passage of a refrigerant fluid;

a clamping member attached to the housing member so as to hermetically enclose the evaporator in the through hole of the housing member, said clamping member having an abutting portion integrally formed therefrom for exerting uniform force to the evaporator to maintain the evaporator in thermal contact with said electronic component; and a refrigeration system in fluid communication with the fluid flow channel of the evaporator to supply refrigerant fluid thereto;

wherein the abutting portion is in the form of an annular wall downwardly extending from the clamping member.

2. The cooling device of claim 1, wherein the evaporator defines an annular groove for receiving said annular wall of said clamping member when attached thereto.

3. The cooling device of claim 2, wherein a resilient element is disposed in the groove between the annular wall of the clamping member and the evaporator.

4. The cooling device of claim 1, further comprising a spring member compressively located between the clamping member and the evaporator.

5. The cooling device of claim 4, wherein the evaporator defines a positioning hole for locating a lower portion of the spring member.

6. The cooling device of claim 1, wherein the housing member and the evaporator each have a generally cylindrical configuration.

7. The cooling device of claim 5, wherein the evaporator circumferentially defines a pair of spaced annular grooves in which a pair of resilient seals is respectively disposed in abutment with an inner wall of the housing member to maintain the evaporator in coaxial alignment with the housing member.

8. The cooling device of claim 1, wherein the evaporator has a two-portion configuration with the fluid flow channel defined in the lower portion thereof.

9. The cooling device of claim 1, wherein the clamping member, the housing member and the printed circuit board are secured together by a plurality of through-bolts.

10. The cooling device of claim 1, wherein the refrigeration system comprises an outlet tube and an capillary tube both connected to the evaporator with the capillary tube locating inside of the outlet tube.

11. The cooling device of claim 10, wherein the outlet tube has a corrugated portion adjacent to the evaporator for providing thermal and mechanical isolation.

12. A cooling device for dissipating heat from an electronic component, comprising:
   an evaporator disposed next to said electronic component to thermally contact with said electronic component, said evaporator defining therein a fluid flow channel for passage of a refrigerant fluid and transmission of said heat to said refrigerant fluid so as to remove said heat from said electronic component via said refrigerant fluid;
   a refrigeration system in communication with said fluid flow channel of said evaporator to receive said refrigerant fluid from said fluid flow channel for removal of said heat and to return said refrigerant fluid back to said fluid flow channel; and
   a clamping member installed next to said evaporator and comprising portions to fix communication parts of said evaporator and said refrigeration system in position, at least one abutting portion extending from said clamping member toward said evaporator around said communication parts of said evaporator and establishing a surface engagement with said evaporator in said evaporator so as to exert force onto said evaporator to maintain intimate thermal contact of said evaporator and said electronic component.

13. The cooling device of claim 12, wherein said at least one abutting portion extends into a corresponding receiving opening formed in said evaporator to establish said surface engagement.

14. The cooling device of claim 13, further comprising another abutting portion extending around said communication parts of said evaporator to exert said force onto said evaporator for said intimate contact, and a distance between said another abutting portion and said communication parts being same as another distance between said at least one abutting portion and said communication parts.

15. The cooling device of claim 12, further comprising a spring member installed around said communication parts of said evaporator and surrounded by said at least one abutting portion of said clamping member.

16. A cooling device for an electronic component mounted on a circuit board, the cooling device comprising:
   a housing member mounted on the circuit board and housing the electronic component therein;
   an evaporator accommodated in the housing member and thermally contacting with the electronic component, the evaporator defining a fluid flow passage adjacent the electronic component;
   a clamping member attached to the housing member to hermetially enclose the evaporator and the electronic component in the housing member;
   a refrigeration system comprising an outlet tube and an capillary tube in fluid communication with the fluid flow passage of the evaporator; and
   an abutting element located apart from the outlet tube and connected between the clamping member and the evaporator for exerting an uniform force to the evaporator to thereby maintain the evaporator firmly contacting with the electronic component.

17. The cooling device of claim 16, wherein the abutting element is an annular abutting wall integrally extending from the clamping member.

18. The cooling device of claim 16, wherein a spring member encircles the outlet tube and is compressed between the clamping member and the evaporator.

19. The cooling device of claim 16, wherein a second abutting element is formed apart from the outlet tube and connected between the clamping member and the evaporator, an even interval is formed between the abutting element and the outlet tube while the same even interval is formed between the second abutting element and the outlet tube.

* * * * *